United States Patent
Sasada et al.

(10) Patent No.: US 6,876,324 B2
(45) Date of Patent: Apr. 5, 2005

(54) RADAR APPARATUS

(75) Inventors: Yoshiyuki Sasada, Hitachinaka (JP); Atsushi Koshizaka, Hitachinaka (JP); Terumi Nakazawa, Naka (JP); Shiro Oouchi, Hitachinaka (JP)

(73) Assignees: Hitachi, Ltd., Tokyo (JP); Hitachi Car Engineering Co., Ltd., Hitachinaka (JP)

( * ) Notice: Subject to any disclaimer, the term of this patent is extended or adjusted under 35 U.S.C. 154(b) by 0 days.

(21) Appl. No.: 10/684,813

(22) Filed: Oct. 15, 2003

(65) Prior Publication Data

US 2004/0135720 A1 Jul. 15, 2004

(30) Foreign Application Priority Data

Oct. 16, 2002 (JP) ........................................ 2002-301218

(51) Int. Cl.⁷ .............................. G01S 7/03; G01S 7/35; G01S 13/93
(52) U.S. Cl. ........................ 342/175; 342/27; 342/70; 342/82; 342/89; 342/118; 342/128
(58) Field of Search ................................. 701/300, 301; 180/167, 168, 169; 342/27, 28, 70, 71, 72, 82, 89, 98, 100, 118, 128, 129–133, 175, 195; 331/67, 68

(56) References Cited

U.S. PATENT DOCUMENTS

| | | | | |
|---|---|---|---|---|
| 5,262,736 A | * | 11/1993 | Watanabe | 331/68 |
| 5,373,262 A | * | 12/1994 | Yamamoto et al. | 331/67 |
| 5,631,609 A | * | 5/1997 | Oka et al. | 331/68 |
| 5,650,755 A | * | 7/1997 | Avanic et al. | 331/67 |
| 5,654,676 A | * | 8/1997 | Avanic et al. | 331/67 |
| 5,745,012 A | * | 4/1998 | Oka et al. | 331/68 |
| 5,959,503 A | * | 9/1999 | Knecht et al. | 331/68 |
| 6,118,347 A | * | 9/2000 | Ohira | 331/68 |

FOREIGN PATENT DOCUMENTS

| | | |
|---|---|---|
| EP | 1049192 A | 11/2000 |
| EP | 1122808 A | 8/2001 |
| JP | 60248001 A | 4/1986 |
| JP | 2000-307305 | 11/2000 |
| JP | 2001-217785 | 8/2001 |

OTHER PUBLICATIONS

M. Zinieris et al. "Analysis of Dielectric Resonator Modes Using the Radial Mode Matching Technique" High Frequency Postgraduate Student Colloquium (1997) pp. 2–7.
H. Kondoh et al. "77 GHz fully–MMIC Automotive Forward–looking radar Yusin P=pHEMTs" (1999) GAAS IC Symposium, pp. 211–214.
European Search Report mailed Jan. 28, 2004.

\* cited by examiner

Primary Examiner—Bernarr E. Gregory
(74) Attorney, Agent, or Firm—Crowell & Moring LLP

(57) ABSTRACT

To provide a filter cover which has little electromagnetic effect on a dielectric resonator and is able to lengthen the life of a press mold without impairing isolation between transmission and reception. A VCO comprising a dielectric resonator, a high-frequency oscillator, a base, a cover, in which the distance between the surface of the cover facing the dielectric resonator and the surface of the base facing the dielectric resonator is half or below of the effective wave length of the oscillator frequency, and the cover has periodic projections facing the dielectric resonator which are a quarter of effective wave length of the oscillator frequency, wherein the nearest distance between the surface of the dielectric resonator facing the cover and the surface of the cover facing the dielectric resonator is a quarter or over of the effective wave length of the oscillator frequency.

12 Claims, 12 Drawing Sheets

RADAR APPARATUS

BACKGROUND OF THE INVENTION

1. Field of the Invention

The present invention relates to a radar apparatus.

2. Description of the Related Art

An automotive radar using millimeter wave, or a high-frequency radio communication apparatus and radio terminal using waves in a frequency band of 300 MHz or above contain a single multifunctional semiconductor device, a semiconductor integrated circuit (IC), an IC package which packages the ICs, a plurality of interconnected ICs or a high-frequency circuit element having a filter function in a housing. This is for the miniaturization, and cost reduction of the apparatuses, and to cope with multi-functionalization of the circuit element to be used.

When packing many functional devices in one housing structure, if the size of the housing remains constant and the number of the functional devices increases, the physical distance between the functional devices will be decreased correspondingly, or the size of the housing will be larger than half the free-space wavelength at a signal frequency (for example, about 1.95 mm at 77 GHz). In either case, radio energy of a signal frequency radiated from one point of IC or the like constituting a functional device within the housing is easily dissipated in the housing, and combines with a functional device within the same housing, thus causing various functional troubles. For example, if part of signals emitted from a transmission function device into the housing is coupled with a reception functional device, a communication transmitter-receiver or a transmitter-receiver module for automotive millimeter wave radar experiences a trouble such as the saturation of a receiver, an increase in received noise or the like.

To cope with these problems, especially an interference problem in the housing, a conventional communication apparatus has divided the housing structure into a plurality of small rooms by metal partitions, or has provided a metal structure along a conventional communication path that serves as a cutoff waveguide structure for locally cutting off unnecessary irradiation. These conventional techniques require a complicated metal structure for the housing structure, and a division of high-frequency board of a passive circuit into a plurality of parts. Further, these structures and the division of the high-frequency board into a plurality of parts make the arrangement of semiconductor ICs and the passive circuit components more difficult, thus inhibiting mass production and cost reduction of the communication apparatus.

JP-A-2000-307305 is among the conventional techniques for solving there problems.

However, while the prevention in JP-A-2000-307305 proposes a mounting configuration in which a filter has a lid formed with projections by extrusion press, the invention does not refer to a relative positional relationship between the projections and the high-frequency circuit elements or passive components, and an optimal configuration of the projections on those positions.

However, a dielectric resonator is generally used as an oscillator which is a high-frequency circuit element. Oscillation frequency of the oscillator changes a lot depending on the dielectric resonator and electric field conditions in the vicinity of the dielectric resonator. Thus, if there exist projections which are extrusion-pressed on the lid in the vicinity of the dielectric resonator, the oscillation frequency changes a lot depending on the shape and position of the projections, thereby making it very difficult to acquire a desired oscillation frequency.

Since the projections are formed by press working, if the projections diminish in size, increase in height, or increase in number, pressing load is increased and thus the life of a press mold will be shortened. Therefore, it is necessary to arrange projections of optimal shape and height only at required places on the lid.

It is an object of the present invention to provide a filter cover that has little electromagnetic effect on the dielectric resonator and is able to lengthen the life of the press mold without injuring isolation between transmission and reception.

SUMMARY OF THE INVENTION

Above object is achieved by a car-mounted radar apparatus comprising a dielectric resonator, a high-frequency oscillator connected to the dielectric resonator for generating a high-frequency, a cover for covering a base where a dielectric resonator and a high-frequency oscillator are deposited, and the dielectric resonator and high-frequency oscillator with a space therebetween, wherein the distance between the high-frequency oscillator and cover is a quarter or over of the effective wave length of the high-frequency oscillator.

Above object is also achieved by a radar apparatus comprising a dielectric resonator, a high-frequency oscillator connected to the dielectric resonator, a base on which the dielectric resonator and high-frequency oscillator are mounted, a cover bonded to the base for covering the dielectric resonator and high-frequency oscillator, in which the distance between the surface of the cover facing the dielectric resonator and the surface of the base facing the dielectric resonator is half or below of the effective wave length of the oscillator frequency, and the cover has periodic projections facing the dielectric resonator which are a quarter of the effective wave length of the oscillator frequency, wherein the nearest distance between the surface of the dielectric resonator facing the cover and the surface of the cover facing the dielectric resonator is a quarter or over of the effective wave length of the oscillator frequency.

Above object is also achieved by a radar apparatus comprising an MMIC that includes an oscillator, an amplifier and a mixer, a circuit board on which the MMIC is mounted and connected, an antenna board on which antennae are mounted, a base on which the circuit board and antenna board are mounted and a coaxial cable or waveguide which passes through the base and connects the circuit board and antenna board is held, and a cover which is bonded to the base to cover the MMIC and circuit board, and is provided with projections facing the MMIC and circuit board, wherein at least any of the pitch, size, and shape of the projections formed on a place of the cover unit facing the coaxial cable or waveguide differs from that of the projections formed on other place than the foregoing of the cover unit.

Other objects, features and advantages of the invention will become apparent from the following description of the embodiments of the invention taken in conjunction with the accompanying drawings.

DETAILED DESCRIPTION OF THE EMBODIMENTS

A radar apparatus according to the present invention will be described with reference to FIG. 1.

Figure 1A:
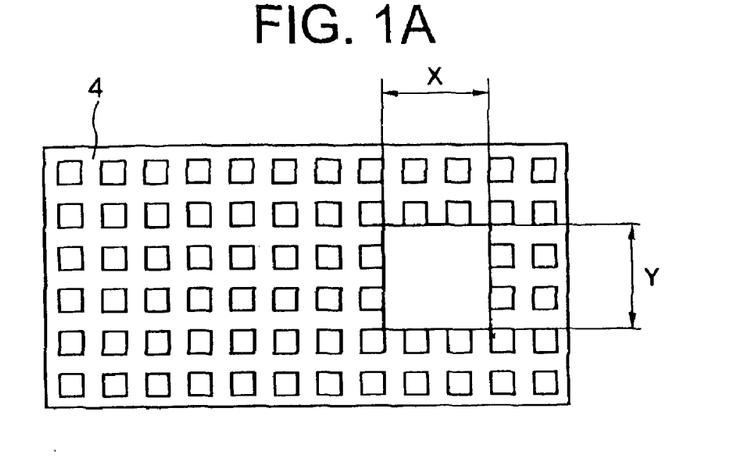
FIGS. 1A to 1C are diagrams showing a first embodiment according to the present invention.
Figure 1B:
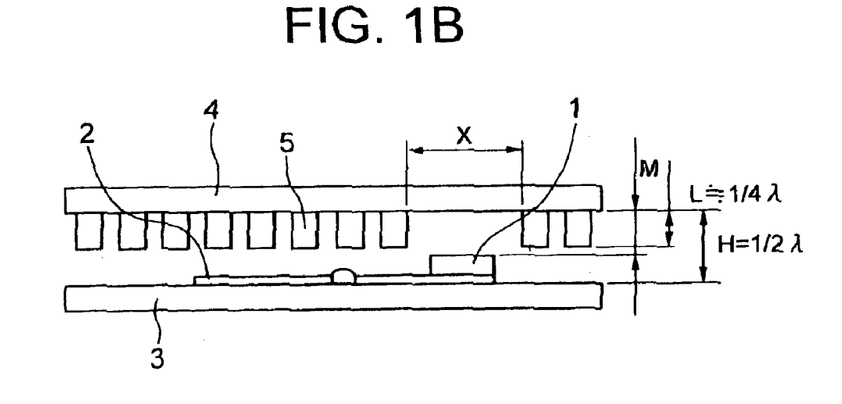
Figure 1C:
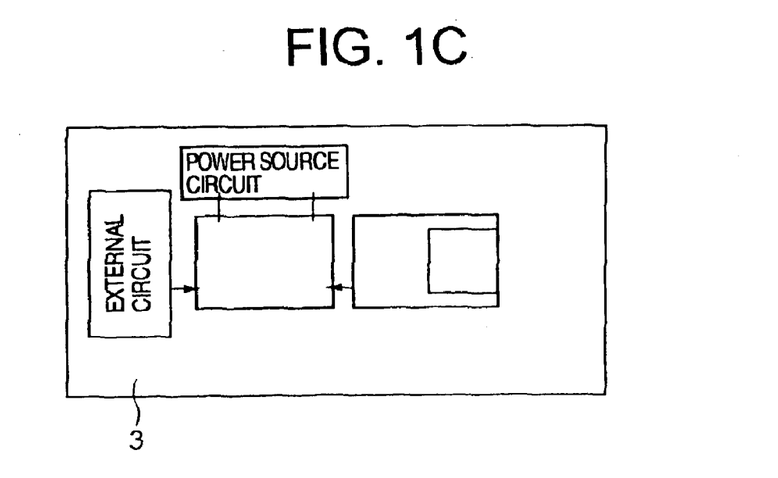

FIG. 1 shows oscillation unit of a high-frequency module, which comprises a dielectric resonator 1, a high-frequency oscillator 2 connected to the dielectric resonator 1, a base 3 where the dielectric resonator 1 and high-frequency oscillator 2 are mounted, and a cover unit 4 bonded to the base 3 for covering the dielectric resonator 1 and high-frequency oscillator 2, wherein the distance H between the surface of the cover unit 4 facing the dielectric resonator 1 and the surface of the base 3 facing the dielectric resonator 1 is half or below of the effective wave length of the frequency of the oscillator 2, and the cover unit 4 has periodic projections 5 facing the dielectric resonator 1 which have a length L, a quarter of the effective wave length of frequency of the oscillator 2.

Figure 2A:
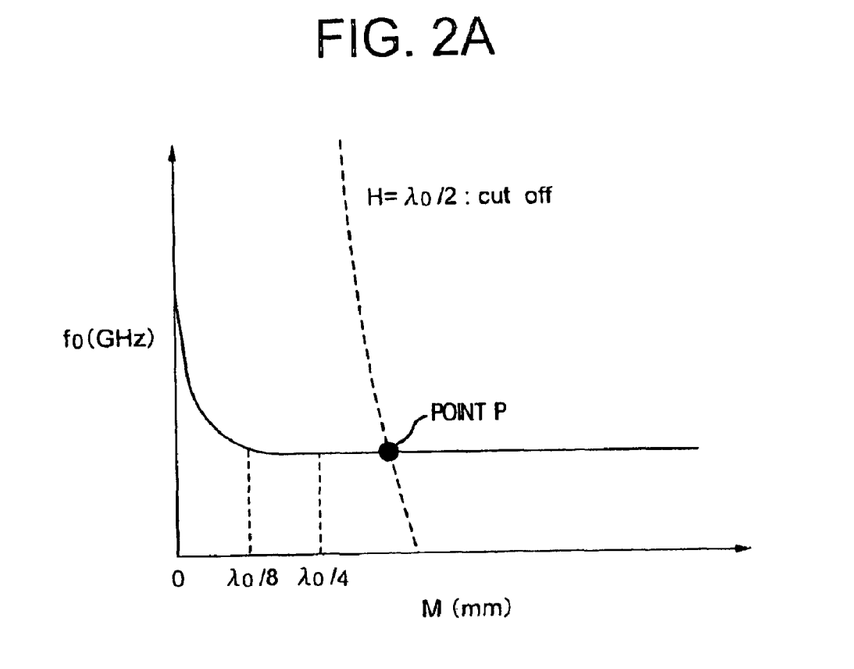
FIGS. 2A and 2B are a graph and a diagram, respectively, for complementing the first embodiment according to the present invention.
Figure 2B:
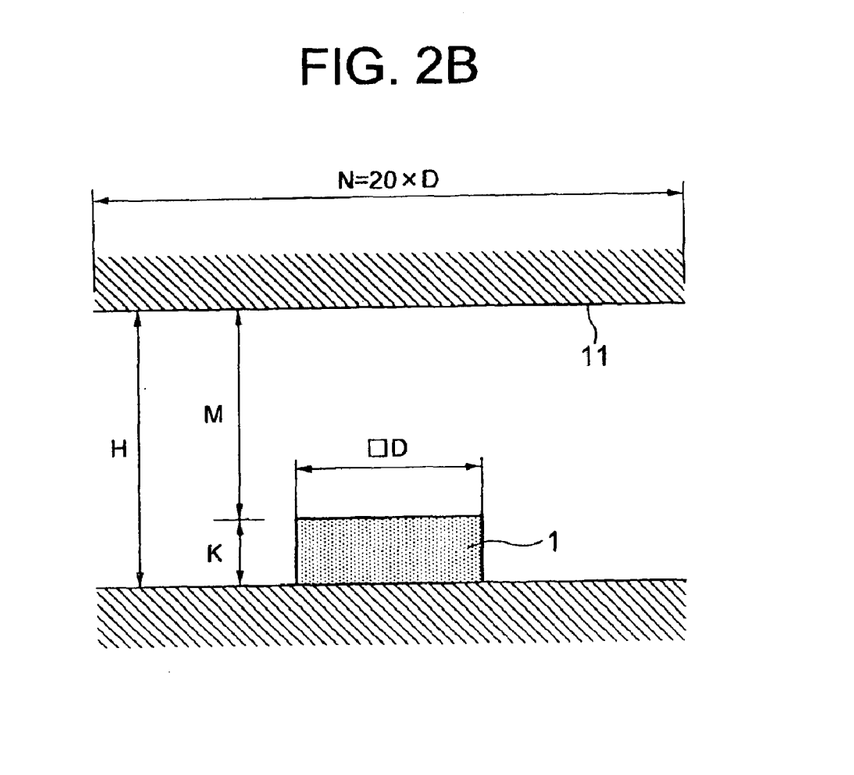

FIGS. 2A and 2B will be described.

FIG. 2A shows that resonance frequency f0 changes as the distance M between a dielectric resonator and an outer wall 11 changes.

A graph of solid line in FIG. 2A shows that sensitivity of resonance frequency relative to M begins to decrease from about one eighth of wavelength at resonance frequency f0, and there is no sensitivity at about a quarter of wavelength. Further, a graph of broken line shows a cut off frequency relative to M. A point P shows that the frequency of the dielectric resonator 1 just matches the cut off frequency, and if M is not smaller than a value represented by the point P, a noise level at the frequency band f0 will rise.

Therefore, preferably, $\frac{1}{4}\lambda 0 \leq M$, $H \leq \lambda$.

Now, return to FIG. 1.

Here, note that projections 5 are not formed on at least a portion of the cover unit 4 facing the dielectric resonator 1. At this time, since H is set to be a little bit smaller than $\frac{1}{2}\lambda$, and the height of the dielectric resonator 1 is generally smaller than $\frac{1}{4}\lambda 0$, the distance between the dielectric resonator 1 and the cover unit 4 becomes $\frac{1}{4}\lambda 0 \leq M$, and the oscillation frequency does not change depending on the presence or absence of the filter cover unit 4. Further, desired oscillation frequency is easily acquired, and since frequency band at f0 is cut off frequency or below, it is possible to suppress the noise level. Thus, it can be said that this filter cover structure is highly superior. It should be noted that the dimensions of X and Y of the portion where the intrusions 5 are not formed are far enough from the frequency f1 acquired from the following expression (1) such that they do not resonate with f0 as a cavity resonator.

$$f1 = C/2 \times \sqrt{((m/X)^2 + (n/Y)^2 + (s/H)^2)} \quad (1)$$

C: velocity of light, m, n, s: resonation mode
Specific dimensions are as below;
Dimension of the dielectric resonator 1:
□1.32 mm×0.53 mm
H=1.9 mm
L=0.9 mm
M=1.9−0.53=1.37 mm
X=3.5 mm
f0=76.5 GHz λ0=3.9 mm However, the shape of the dielectric resonator is not necessarily square, and a round or a just polygonal shape is acceptable.

Figure 3A:
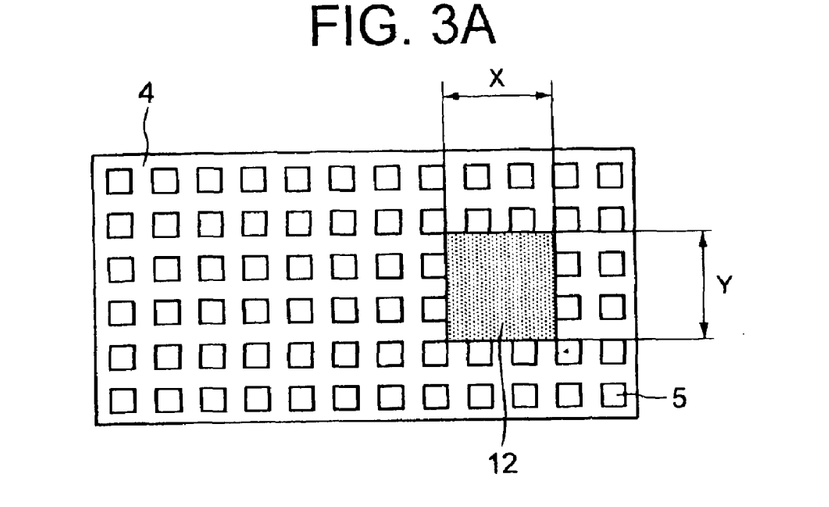
FIGS. 3A to 3C are diagrams showing an application example 1 of the first embodiment according to the present invention.
Figure 3B:
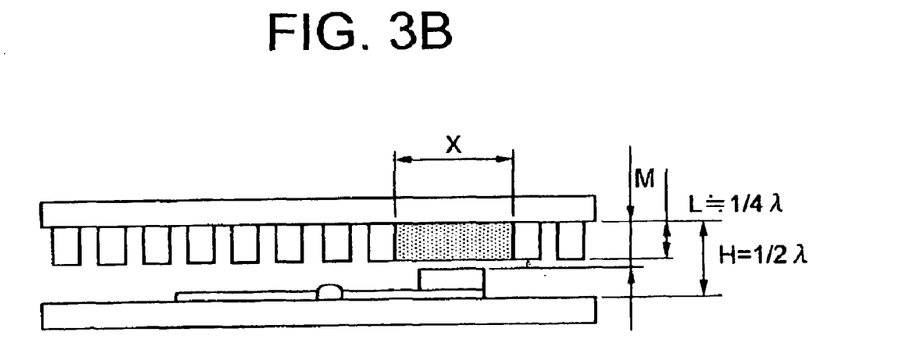
Figure 3C:
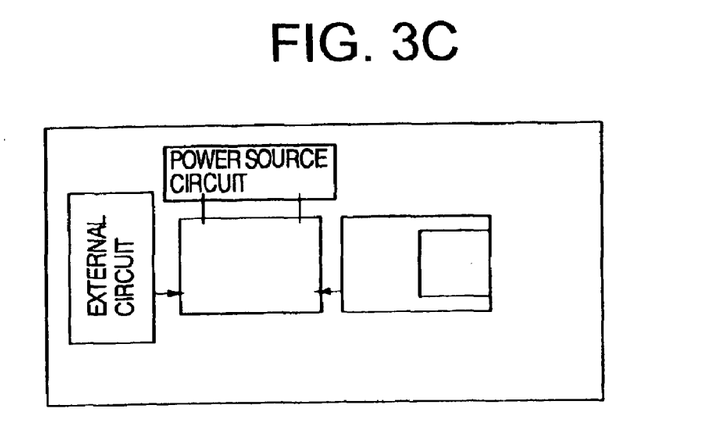

When a wave absorber 12 is mounted on a portion as shown in FIGS. 3A, and 3B that corresponds to that in FIGS. 1A and 1B where projections were not formed, it can compensate the filter characteristics that were lost due to the lack of the projections 5, and frequency variation caused by the cover unit 4 is minimized. Thus, it can be said that the filter structure is highly superior.

Figure 4A:
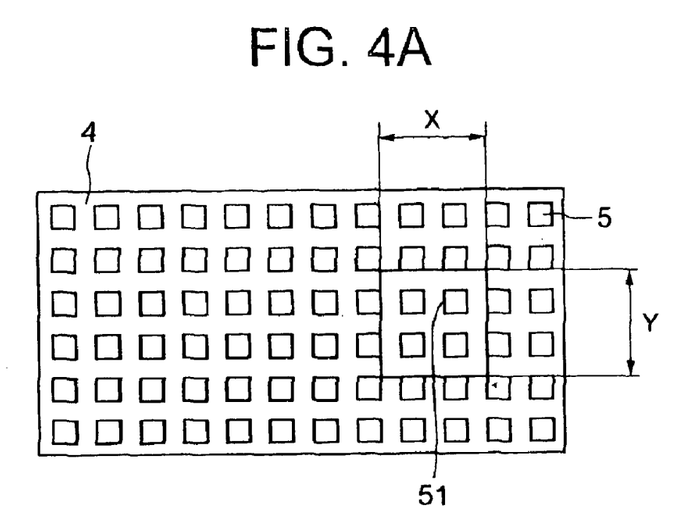
FIGS. 4A to 4C are diagrams showing an application example 2 of the first embodiment according to the present invention.
Figure 4B:
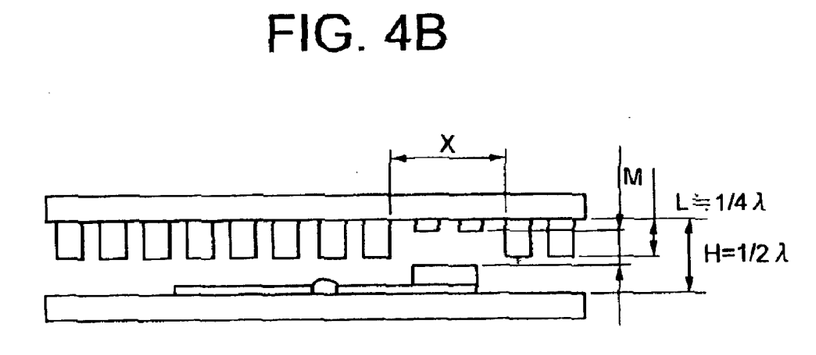
Figure 4C:
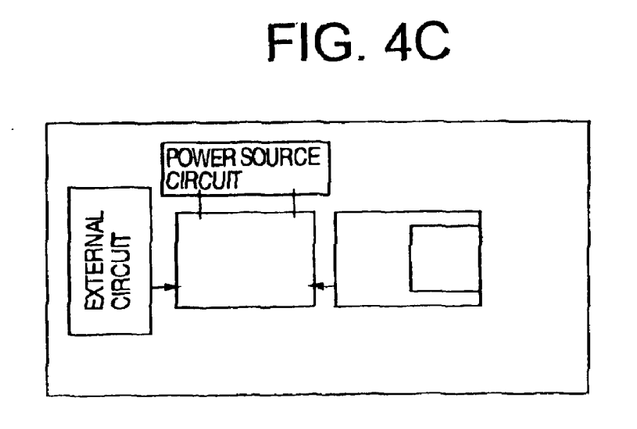

Further, the deterioration of filter characteristics is prevented and frequency variation caused by the cover unit 4 is minimized by forming a few projections 51 as shown in FIGS. 4A and 4B, while satisfying $\frac{1}{4}\lambda \leq M$. Thus, it can be said that the filter structure is highly superior.

Figure 5A:
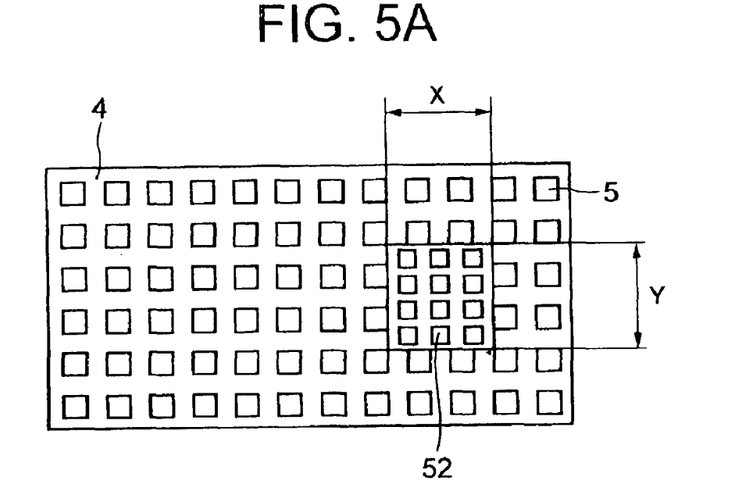
FIGS. 5A to 5C are diagrams showing an application example 3 of the first embodiment according to the present invention.
Figure 5B:
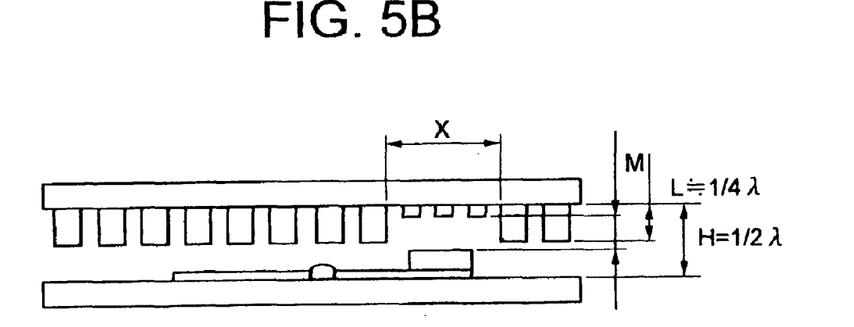
Figure 5C:
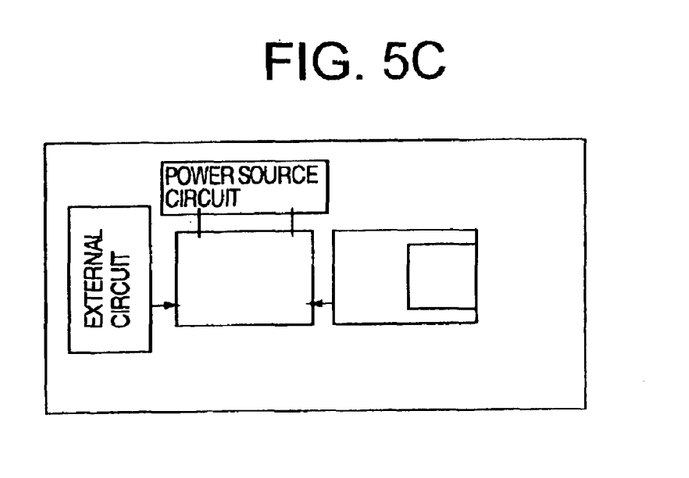

Further, deterioration of filter characteristics is prevented and frequency variation caused by the cover unit 4 is minimized by forming projections 52 as shown in FIG. 5A, which are smaller in shape than other projections, on portions corresponding to those in FIG. 1A where projections 5 were not formed. Thus, it can be said that the filter structure is highly superior.

Figure 6A:
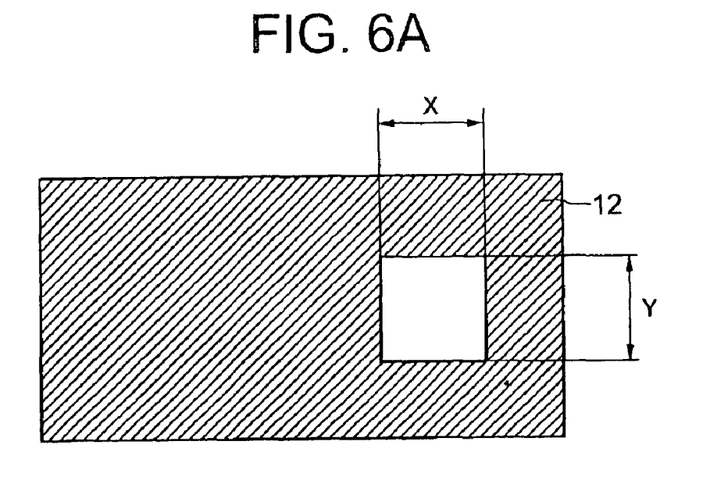
FIGS. 6A to 6C are diagrams showing an application example 4 of the first embodiment according to the present invention.
Figure 6B:
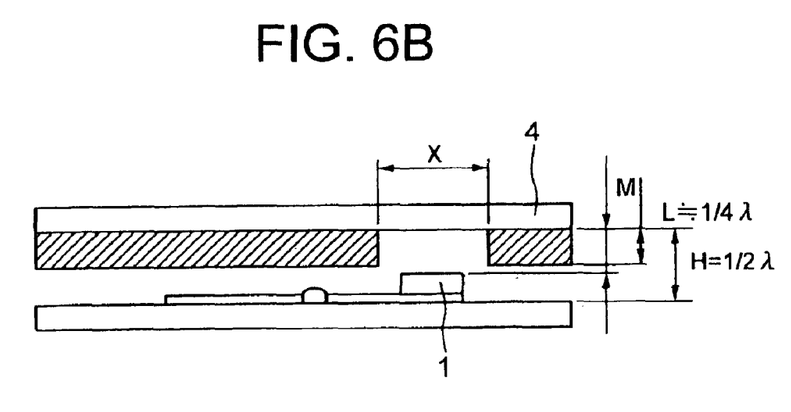
Figure 6C:
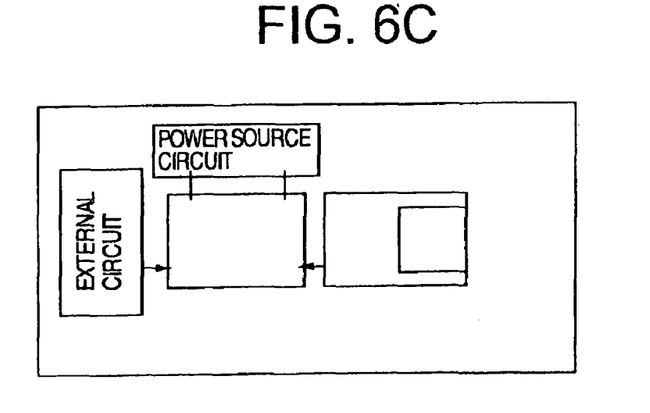

Next, description will be given of the filter cover unit structure 4 whose filter characteristics are provided by wave absorber 12 instead of projections with reference to FIGS. 6A, and 6B. In this case, if the dielectric resonator 1 is near to the wave absorber 12, oscillation frequency also changes a lot depending on the presence or absence of the filter cover 4. Therefore, to cope with this, the wave absorbers 12 formed on a portion corresponding to that in FIG. 1, where projections 5 are not formed, are taken out as shown in the FIGS. 6A and 6B. With this, a filter cover unit having the same effect with that in FIGS. 1A and 1B can be provided. Here, a material or a structure, that absorbs electric wave better than the cover unit 4, is used for the wave absorber 12.

Figure 7A:
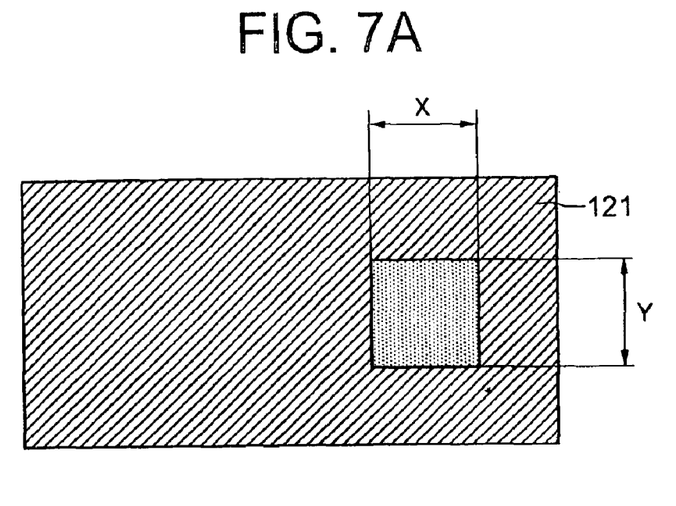
FIGS. 7A to 7C are diagrams showing an application example 5 of the first embodiment according to the present invention.
Figure 7B:
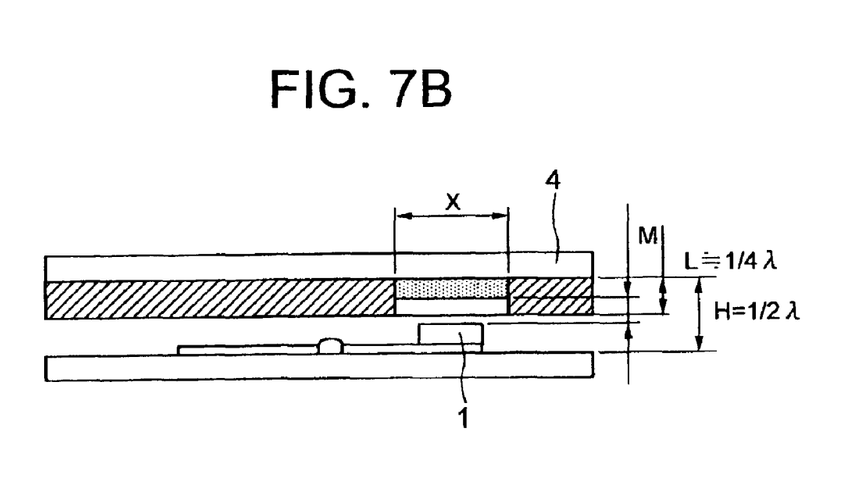
Figure 7C:
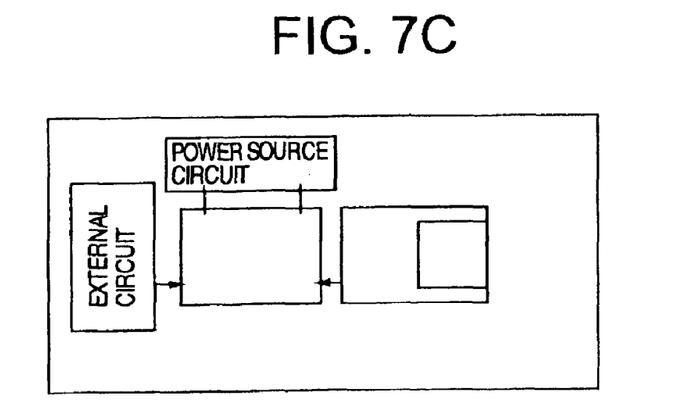

Further, the deterioration of filter characteristics is prevented and the frequency variation caused by the cover unit 4 is minimized by satisfying $\frac{1}{4}\lambda \leq M$ while forming a few wave absorbers 121, as shown by FIGS. 7A and 7B, on a portion corresponding to a portion in FIG. 1A where the projections 5 are not formed. Thus, it can be said the filter cover structure is highly superior. Thus, it can be said that the filter structure is highly superior.

Another filter cover unit 4 according to the present invention will be described with reference to FIG. 8.

Figure 8:
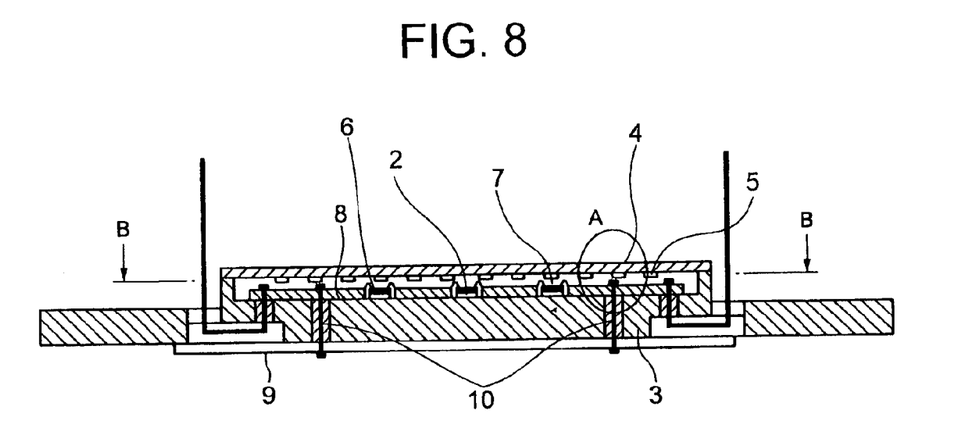
FIG. 8 is a view showing a second embodiment according to the present invention.

FIG. 8 shows a transmitter-receiver. It comprises a MMIC (Monolithic Microwave Integrated Circuit) including an oscillator 2, an amplifier 6, and a mixer 7, a circuit board 8 where the MMIC is mounted and connected, an antenna board 9 where antennae are disposed, a base 3 where a coaxial cable 10 or a waveguide, which passes through the base to connect the circuit board 8, and antenna board 9 are held, and a cover unit 4 which is bonded to the base 3 to cover the MMIC and circuit board 8 and is provided with projections 5 on the side thereof facing the MMIC and circuit board 8.

The projections 5 are formed by press working. As the projections reduce in size, increase in height, or increase in number thereof, a pressing load increases correspondingly and thereby shortens the life of a press mold. Therefore, projections must be formed that have an optimum shape and height only at necessary locations on the cover unit 4.

Figure 9:
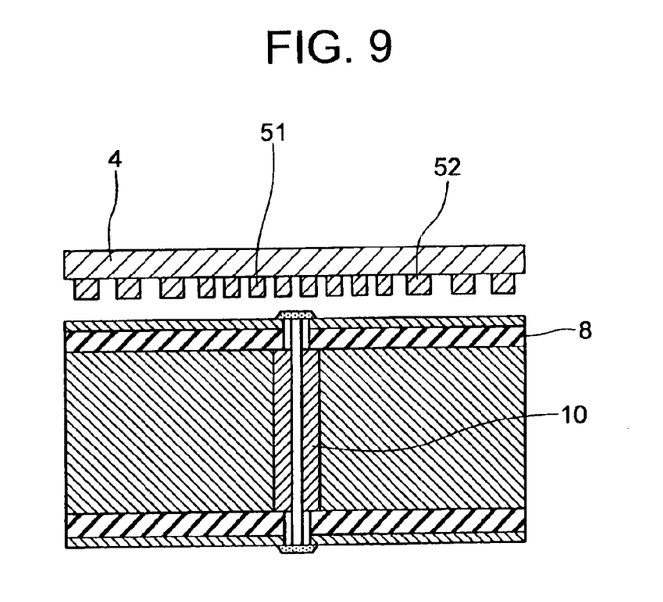
FIG. 9 is an enlarged view of a section A in FIG. 8.

Here, the pitch, size and shape of projections formed on a place of the cover unit 4 that faces the coaxial cable 10 or waveguide are changed from those of the projections formed on other place of the cover unit 4 than the forgoing place as shown by projections 51 and 52 in FIG. 9.

Although unwanted electric wave is irradiated, at this time, due to unmatched impedance at a converting portion of a transmission path from the coaxial cable 10 or waveguide to the circuit board 8, the dissipation of the unwanted electric wave is suppressed by forming smaller projections 51 at a place of the cover unit 4 that face the coaxial cable 10 or waveguide. At the same time, larger projections 52 are formed on a place of the cover unit 4 other than the foregoing one, thus making it possible to lengthen the life of the press mold. It can be said that the filter cover structure is highly superior.

Specific dimensions are as below;
Projections 51: 0.5 mm×0.8 mm
Projections 52: 0.7 mm×0.8 mm Further, the pitch, size, and shape of the projections formed on a place of the cover unit 4 that faces the coaxial cable (transmission side) 101—coaxial cable (reception side) 102 are changed from those of the projections formed on a place of the cover unit 4 that faces a coaxial cable (reception side A) 1021—coaxial cable (reception side B) 1022, as shown by projections 51 and 52 in FIG. 10.

Figure 10:
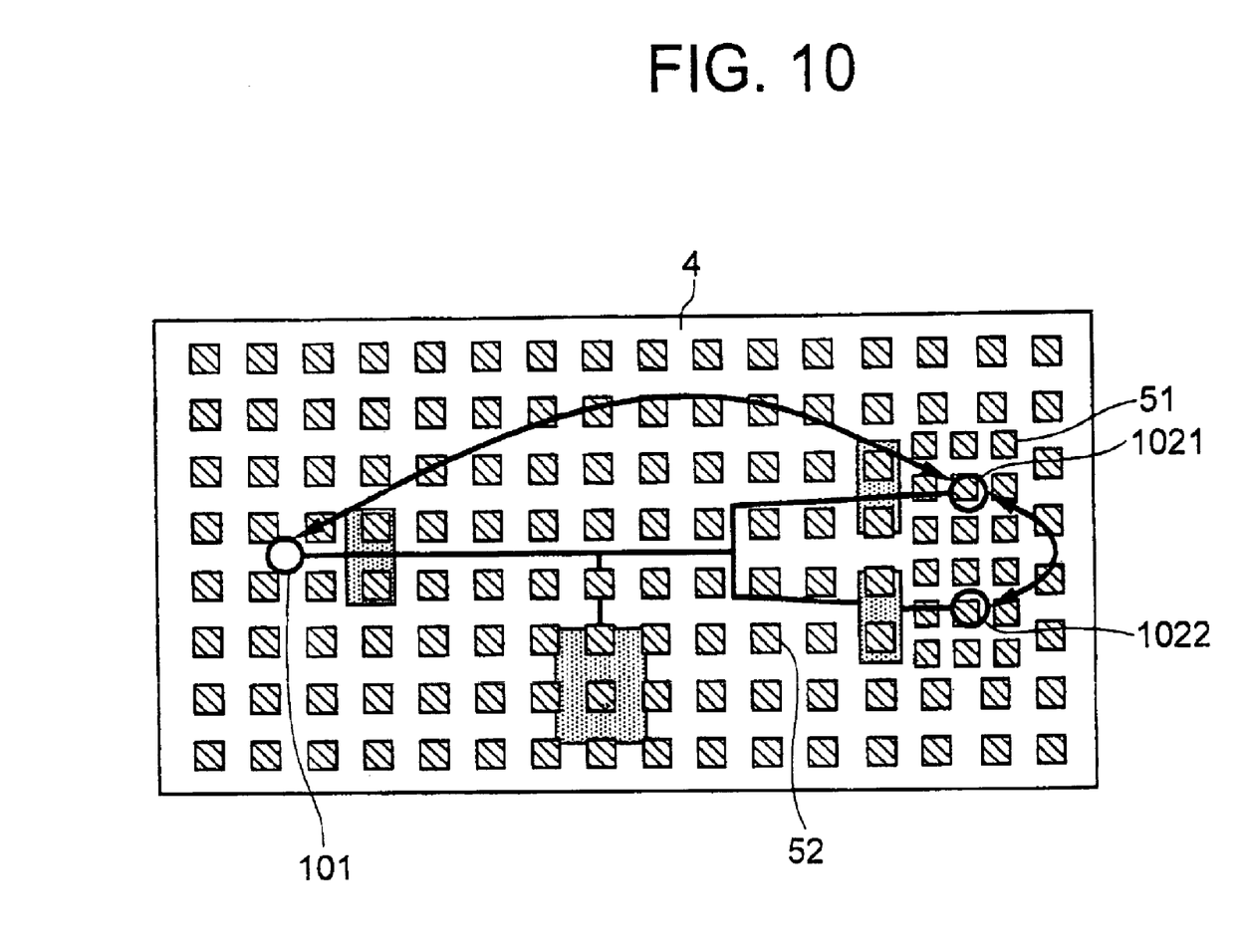
FIG. 10 is a sectional view taken along B—B in FIG. 8.

Since the level of power radiated from the coaxial cable (transmission side) 101 differs from the level of power radiated from the coaxial cable (reception side) 102, and the distance between the each cable also differs, the isolation level required between the coaxial cable (transmission side) 101 and the coaxial cable (reception side) 102 differs from that required between the coaxial cable (transmission side A) 1021 and coaxial cable (reception side B) 1022.

At this time, isolation can be secured even in a short distance by forming smaller projections 51 on a place of the cover unit 4 that faces the coaxial cable (reception side A) 1021—coaxial cable (reception side B) 1022. Further, the life of the press mold can be lengthened by forming larger projections 52 on a place of the cover unit 4 that faces the coaxial cable (transmission side) 101—the coaxial cable (reception side) 102. Thus, it can be said that the filter cover structure is highly superior.

Figure 11:
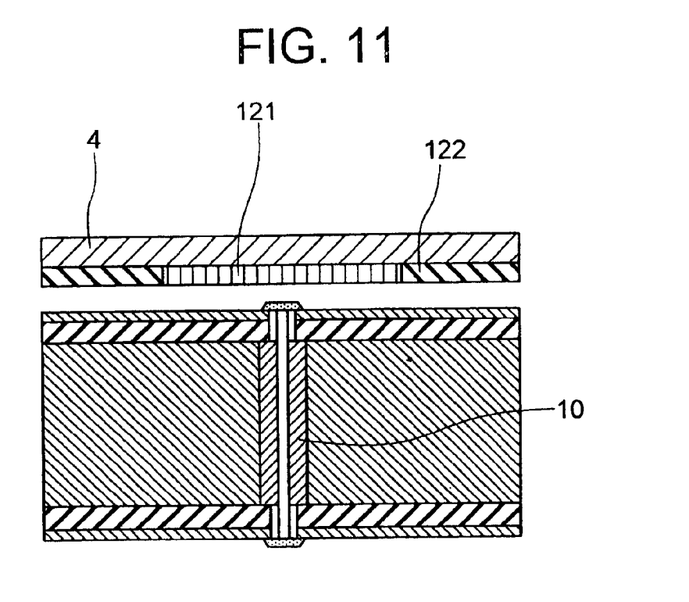
FIG. 11 is an enlarged view A in FIG. 8.

Specific dimensions are as below;
Projection 51: 0.5 mm×0.8 mm
Projection 52: 0.7 mm×0.8 mm Next, description will be given of a filter cover unit 4 whose filtering characteristics are provided by wave absorber instead of projection with reference to FIG. 11. In this case, as is the case with FIG. 9, the wave absorber 121, a material having high wave absorptivity, is formed on a place of the cover unit 4 that faces the coaxial cable 10 or waveguide, while a wave absorber 122, a material having low absorptivity, is formed on other place of the cover unit 4 than the foregoing one, thus dissipation of unwanted wave being suppressed. Further, the wave absorbers are efficiently used, since a material having high absorptivity is generally expensive. Thus, it can be said that the filter cover structure is highly superior.

Figure 12:
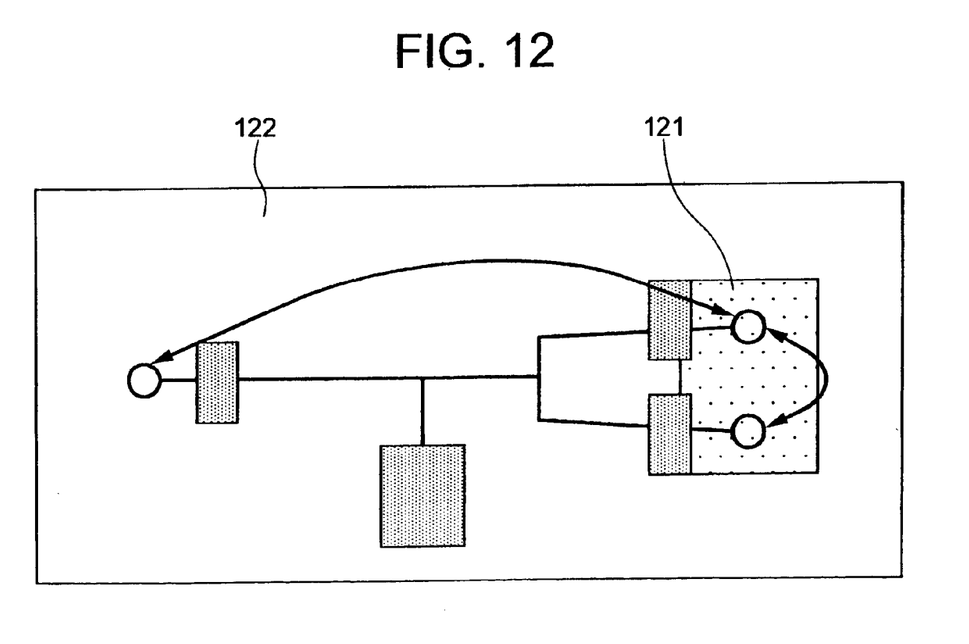
FIG. 12 is a sectional view taken along B—B in FIG. 8.

In FIG. 12, projections 51 and 52 used in FIG. 10 are replaced by wave absorbers 121, and 122, respectively. Wave absorbers, which are expensive, are also efficiently used here, and thus it can be said that the filter cover structure is highly superior.

Figure 13:
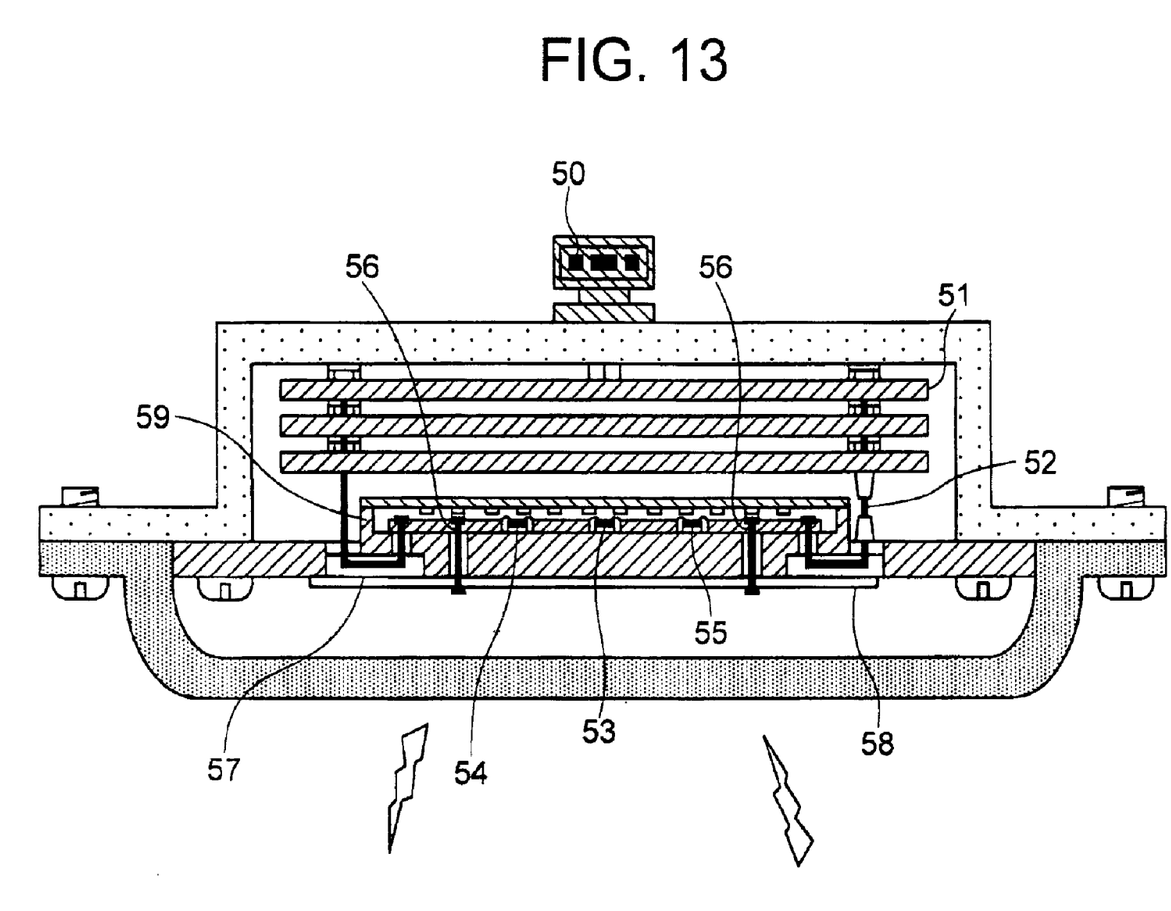
FIG. 13 a structural view showing a car-mounted radar using a transmitter-receiver according to the present invention.
Figure 14:
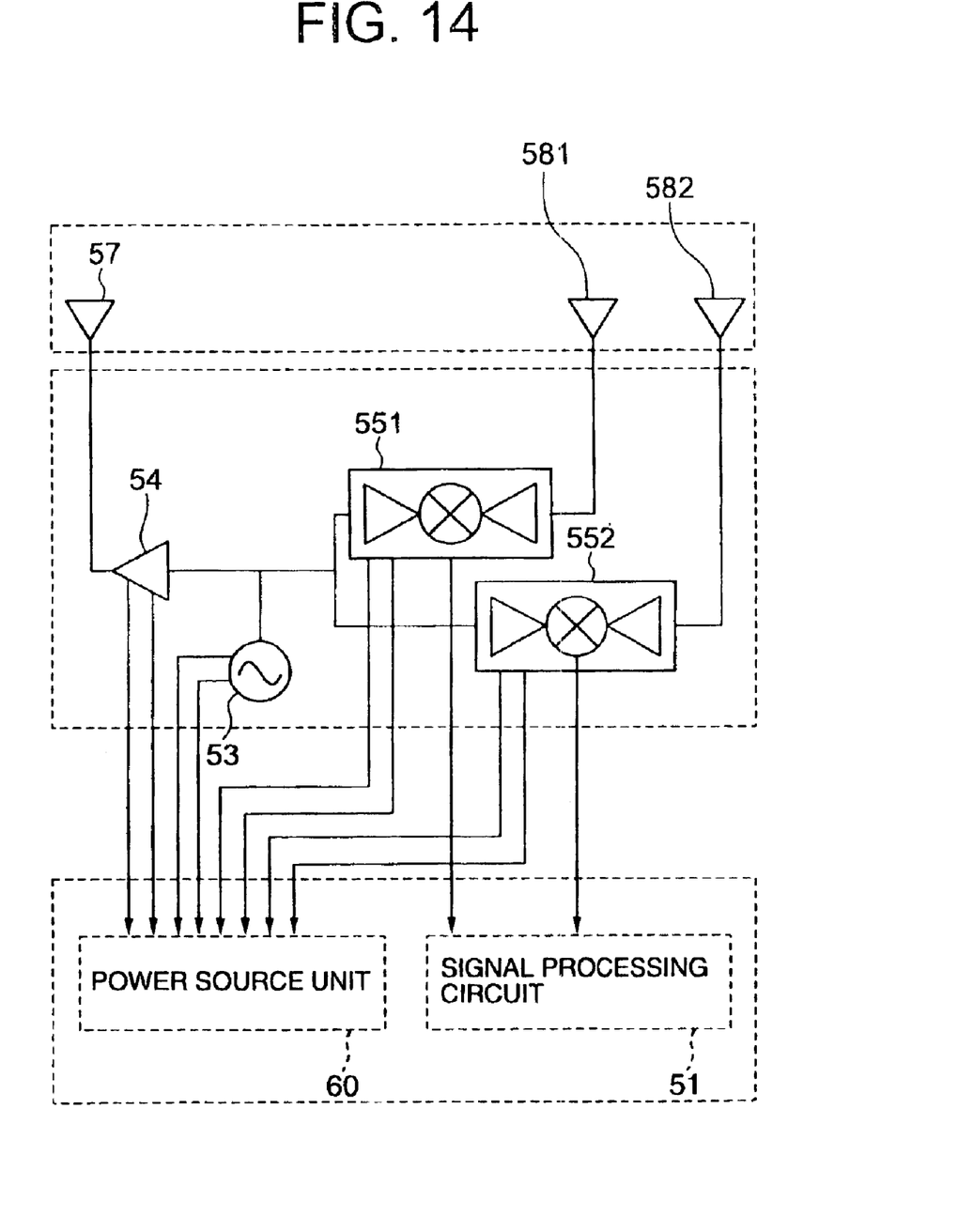
FIG. 14 is a circuit diagram for a car-mounted radar using a transmitter-receiver according to the present invention.

Next, description will be given of a car-mounted radar using the transmitter-receiver shown in FIG. 8 with reference to FIGS. 13 and 14. Its structure will be described with reference to FIG. 13. Power is supplied from a connector 50 to a signal processing circuit 51, and the signal processing circuit 51, at the same time, supplies predetermined power to the transmitter—receiver 59 via a cable 52. With this, an oscillator 53 generates millimeter wave of 76.5 GHz, which is amplified by an amplifier 54 and fed to a transmission antenna 57 via a coaxial cable 56. Millimeter wave is transmitted from the transmission antenna 57, and the reception antenna 58 receives reflected wave after striking a target. Received wave is down-converted with transmission wave by a mixer 55, and transmitted as an IF signal to the signal processing circuit 51 via the cable 52. A relative speed, a distance, an angle and the like between a car or the like on which the radar is mounted and a target are calculated. These results are outputted via the connector 50.

A circuit will be described with reference to FIG. 14.

A car-mounted radar comprises a antenna unit including a transmission antenna 57 and reception antennae 581, 582, a high-frequency wave unit, and a control unit.

The high-frequency unit has a transmission function for outputting a high-frequency signal, which is outputted by the oscillator 53 and amplified by the amplifier 54, to a space in front of a car via the antenna 57, and a reception function for extracting a Doppler signal which is acquired by down-converting a reflected wave from a target that is received by the reception antenna 531, 582 and an output signal of the oscillator 53 by the mixers 551, 552. It should be noted that the oscillator 53, amplifier 54, mixers 551, 552 comprise an integrated circuit such as MMIC (Monolithic Microwave Integrated Circuit) or the like.

The control unit digitizes a Doppler frequency which the high-frequency unit outputted in a signal processing circuit 51, and then calculates a distance, a relative speed, and an angle to a target by signal processing based on various algorithms. Further, a power source unit 60 in the control unit has a function to supply bias supply to each MMIC of the high-frequency unit.

According to the present invention, it is possible to fabricate a filter cover which has little electromagnetic effect on a dielectric resonator.

It is also possible to fabricate a filter cover which is able to lengthening the life of a press mold without impairing isolation between transmission and reception.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A radar apparatus, said apparatus comprising:
   a dielectric resonator;
   a high-frequency oscillator connected to the dielectric resonator for generating a high frequency;
   a base on which said dielectric resonator and high-frequency oscillator are mounted; and
   a cover for covering said dielectric resonator and high-frequency oscillator,
   wherein the distance between said high-frequency oscillator and cover is a quarter or over of the effective wave length of said high-frequency oscillator.

2. The radar apparatus according to claim 1, wherein said cover comprises projections extending towards said dielectric resonator, and the distance between the said high-frequency oscillator and projections is a quarter or over of the effective wave length of said high-frequency oscillator.

3. The radar apparatus according to claim 2, wherein the distance between said base and cover is half or below of the effective wave length of said high-frequency oscillator.

4. The radar apparatus according to claim 3, wherein the height of said projections is a quarter or over of the effective wave length of said high-frequency oscillator.

5. The radar apparatus according to claim 1, wherein a wave absorber which is better at absorbing wave than said cover is provided, and the distance between said high-frequency oscillator and wave absorber is a quarter or over of the effective wave length of said high-frequency oscillator.

6. A radar apparatus, said apparatus comprising:
   a dielectric resonator;
   a high-frequency oscillator connected to the dielectric resonator;
   a base on which the dielectric resonator and high-frequency oscillator are mounted;
   a cover bonded to the base for covering the dielectric resonator and high-frequency oscillator, in which the distance between the surface of the cover facing the dielectric resonator and the surface of the base facing the dielectric resonator is half or below of the effective wave length of the oscillator frequency, the cover having periodic projections facing the dielectric resonator which are a quarter of effective wave length of the oscillator frequency,
   wherein the nearest distance between the surface of the dielectric resonator facing the cover and the surface of the cover facing the dielectric resonator is a quarter or over of the effective wave length of the oscillator frequency.

7. The radar apparatus according to claim 6, wherein said periodic projections are not present on at least portions of said cover facing said dielectric resonator.

8. The radar apparatus according to claim 6, wherein a wave absorber is provided on at least a portion of said cover facing said dielectric resonator.

9. The radar apparatus according to claim 6, wherein a resonance frequency of cavity shape formed on a portion of said cover facing said dielectric resonator is way from the frequency of said oscillator by at least 2%.

10. The radar apparatus according to claim 6, the apparatus having a wave absorber that faces the dielectric resonator, wherein the nearest distance between the surface of said dielectric resonator facing the cover and the surface of the wave absorber facing the dielectric resonator is a quarter or over of the frequency of the oscillator.

11. A radar apparatus, comprising:
   an MMIC including an oscillator, an amplifier and a mixer;
   a circuit board on which the MMIC is mounted and connected;
   an antenna board on which an antenna is mounted;
   a base on which the circuit board and antenna board are mounted and a coaxial cable or waveguide are held which passes through the base to connect the circuit board and antenna board; and
   a cover which is bonded to the base to cover the MMIC and circuit board, and is provided with projections facing the circuit board,
   wherein at least any of the pitch, size, and shape of the projections formed on a place of the cover unit that faces the coaxial cable or waveguide differs from that of the projections formed on other place of the cover unit than the foregoing one.

12. The radar apparatus according claim 11, wherein a wave absorber is formed on the cover instead of said projections, and the absoptivity of the wave absorber existing on a place facing said coaxial cable or wave guide differs from that of a wave absorber existing on other place than the foregoing one.

* * * * *